United States Patent
Liu et al.

(10) Patent No.: US 10,854,133 B2
(45) Date of Patent: Dec. 1, 2020

(54) MICRO LED DISPLAY PANEL

(71) Applicant: HON HAI PRECISION INDUSTRY CO., LTD., New Taipei (TW)

(72) Inventors: Chia-Lin Liu, New Taipei (TW); Yu-Fu Weng, New Taipei (TW); Chien-Wen Lin, New Taipei (TW); Tzu-Yu Cheng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 21 days.

(21) Appl. No.: 16/028,564

(22) Filed: Jul. 6, 2018

(65) Prior Publication Data

US 2019/0012957 A1 Jan. 10, 2019

Related U.S. Application Data

(60) Provisional application No. 62/529,005, filed on Jul. 6, 2017.

(51) Int. Cl.
| | |
|---|---|
| *G09G 3/32* | (2016.01) |
| *G06F 3/041* | (2006.01) |
| *G06F 1/16* | (2006.01) |
| *G06F 3/044* | (2006.01) |
| *H01L 25/075* | (2006.01) |
| *H01L 25/16* | (2006.01) |
| *H01L 33/62* | (2010.01) |

(52) U.S. Cl.
CPC ............ *G09G 3/32* (2013.01); *G06F 1/1643* (2013.01); *G06F 3/044* (2013.01); *G06F 3/0412* (2013.01); *H01L 25/0753* (2013.01); *G06F 2203/04112* (2013.01); *G09G 2300/0426* (2013.01); *H01L 25/167* (2013.01); *H01L 33/62* (2013.01)

(58) Field of Classification Search
CPC ... H01L 25/0753; H01L 25/167; H01L 33/62; H01L 27/323; G06F 3/044; G06F 3/0412; G06F 3/0443; G06F 3/04184; G06F 3/0418; G06F 3/04164; G06F 1/1643; G06F 2203/04112; G09G 3/32; G09G 3/3233; G09G 3/3258; G09G 2300/0426; G09G 2300/0842; G09G 2310/0251; G09G 2354/00
See application file for complete search history.

(56) References Cited

U.S. PATENT DOCUMENTS

| | | | |
|---|---|---|---|
| 2016/0163940 A1* | 6/2016 | Huang | H01L 33/62 257/89 |
| 2018/0224968 A1* | 8/2018 | Church | G06F 3/0412 |
| 2019/0237021 A1* | 8/2019 | Peng | G06F 1/3265 |

* cited by examiner

*Primary Examiner* — Christopher E Leiby
(74) *Attorney, Agent, or Firm* — ScienBiziP, P.C.

(57) ABSTRACT

A micro LED display panel includes a first metal layer, a micro LED layer on the first metal layer, and a transparent conductive layer on a side of the micro LED layer opposite from the first metal layer. The micro LED layer includes a plurality of micro LEDs spaced apart from each other. The first metal layer includes a plurality of first metal units spaced apart from each other. The plurality of first metal units serve as anodes or cathodes of the plurality of micro LEDs. The transparent conductive layer includes a plurality of transparent conductive units spaced apart from each other. The plurality of transparent conductive units serve as anodes or cathodes of the plurality of micro LEDs and are multiplexed as touch electrodes. The micro LED display panel of the present disclosure has both a display function and a touch function.

17 Claims, 7 Drawing Sheets

MICRO LED DISPLAY PANEL

FIELD

The subject matter herein relates to display technology, and particularly relates to a micro LED display panel.

BACKGROUND

Micro-LED (Micro Light Emitting Display), also known as micro LED or µLED, is an emerging flat panel display technology. Currently, a micro LED display panel generally includes an N-type doped inorganic light-emitting material layer, a P-type doped inorganic light-emitting material layer, a transparent conductive layer coupled to the N-type doped inorganic light-emitting material layer (as a cathode), and a metal layer coupled to the P-type doped inorganic light-emitting material layer (as an anode). However, a conventional micro LED display panel is generally not provided with in-cell touch sensing electrodes.

Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
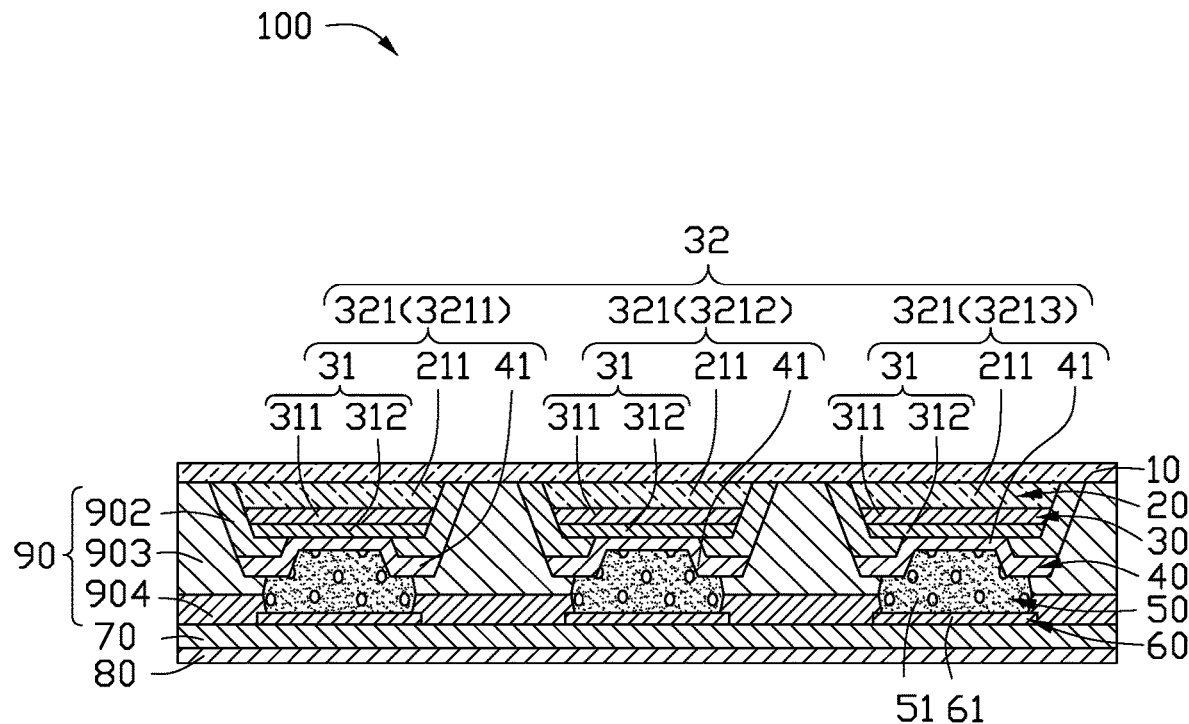
FIG. 1 is a cross-sectional view of a first embodiment of a micro LED display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

The term "micro LED" in this disclosure refers to an LED having a size less than five hundred micrometers. More specifically, it refers to an LED having a size in the range of approximately one micrometer to one hundred micrometers.

First Embodiment

FIG. 1 illustrates a micro LED display panel 100 according to a first embodiment. As shown in FIG. 1, the micro LED display panel 100 includes a first metal layer 40, a micro LED layer 30 on the first metal layer 40, a transparent conductive layer 20 on a side of the micro LED layer 30 opposite from the first metal layer 40, and an upper substrate 10 covering the transparent conductive layer 20. The upper substrate 10 is transparent, the transparent conductive layer 20 includes a plurality of transparent conductive units 211 spaced apart from each other, the micro LED layer 30 includes a plurality of micro LEDs 31 spaced apart from each other, and the first metal layer 40 includes a plurality of first metal units 41 spaced apart from each other. The first metal units 41 serve as anodes or cathodes of the micro LEDs 31, and the transparent conductive units 211 serve as anodes or cathodes of the micro LEDs 31 and are multiplexed as touch electrodes. When the first metal units 41 serve as anodes of the micro LEDs 31, the transparent conductive units 211 serve as cathodes of the micro LEDs 31. Alternatively, when the first metal units 41 serve as cathodes of the micro LEDs 31, the transparent conductive units 211 serve as anodes of the micro LEDs 31.

Referring to FIG. 1, the micro LED display panel 100 includes a plurality of sub-pixels 321, and a plurality of adjacent sub-pixels 321 emitting light of different colors form one pixel 32. In this embodiment, each pixel 32 includes three adjacent sub-pixels 321, each sub-pixel 321 emitting one of three different colors. The three adjacent sub-pixels 321 are a first color sub-pixel 3211, a second color sub-pixel 3212, and a third color sub-pixel 3213. The first color sub-pixel 3211 includes a red micro LED 31 emitting red light, the second color sub-pixel 3212 includes a green micro LED 31 emitting green light, and the third color sub-pixel 3213 includes a blue micro LED 31 emitting blue light. In other embodiments of the present disclosure, the first color sub-pixels 3211, the second color sub-pixels 3212, and the third color sub-pixels 3213 may also include micro LEDs 31 that emit other colored lights.

In other embodiments, each pixel 32 may also include three or more adjacent sub-pixels. For example, four adjacent sub-pixels 321 may form one pixel 32. The adjacent four sub-pixels 321 may include a red micro LED 31 emitting red light, a green micro LED 31 emitting green light, a blue micro LED 31 emitting blue light, and a white micro LED 31 emitting white light.

Referring to FIG. 1, each sub-pixel 321 includes a micro LED 31, a transparent conductive unit 211 stacked above the micro LED 31, and a first metal unit 41 stacked below the micro LED 31. Each micro LED 31 includes an N-type doped inorganic non-metal layer 311, a P-type doped inorganic non-metal layer 312, and an active layer (not shown) between the N-type doped inorganic non-metal layer 311 and the P-type doped inorganic non-metal layer 312. By adjusting the material of the active layer of the micro LED 31, the color of light emitted by the micro LED 31 can be of different colors. Thus, different sub-pixels 321 can emit light of different colors.

Referring to FIG. 1, the micro LED display panel 100 further includes a lower substrate 80 and a control circuit layer 70 disposed on the lower substrate 80. The lower substrate 80 and the upper substrate 10 are spaced apart from, and opposite to, each other. The pixels 32 and the control circuit layer 70 are located between the lower substrate 80 and the upper substrate 10. Each first metal unit 41 is electrically coupled to the control circuit layer 70, and applied with a voltage signal by the control circuit layer 70.

The control circuit layer 70 includes a thin film transistor (TFT) array (not shown). The lower substrate 80 is an insulating substrate carrying the thin film transistor (TFT) array, and the first metal unit 41 corresponding to each sub-pixel 321 is electrically coupled to one thin film transistor (TFT). Additionally, the control circuit layer 70 also includes a signal source (not shown) for switching power and control signals. The signal source may be a Field Programmable Gate Array (FPGA), an Integrated Circuit (IC), or the like.

Referring to FIG. 1, the micro LED display panel 100 further includes a second metal layer 60 and an anisotropic conductive material layer 50 disposed on the second metal layer 60. The anisotropic conductive material layer 50 includes a plurality of anisotropic conductive units 51 spaced apart from each other. The second metal layer 60 includes a plurality of second metal units 61 spaced apart from each other. Each transparent conductive unit 211, one micro LED 31, one first metal unit 41, one anisotropic conductive unit 51, and one second metal unit 61 are sequentially stacked. Each anisotropic conductive unit 51 overlaps with one second metal unit 61. Each first metal unit 41 overlaps with one anisotropic conductive unit 51. Each anisotropic conductive unit 51 can electrically couple one first metal unit 41 and one second metal unit 61. Each second metal unit 61 is located between one anisotropic conductive unit 51 and the control circuit layer 70. Thus, the control circuit layer 70 can electrically couple the first metal unit 41 and provide a direct current voltage signal to the corresponding micro LED 31 by the first metal unit 41.

Referring to FIG. 1, the micro LED display panel 100 further includes a plurality of insulating structures 90. The insulating structures 90 insulate: the plurality of transparent conductive units 211 from each other; the plurality of micro LEDs 31 from each other; the plurality of first metal units 41 from each other; the plurality of anisotropic conductive unit 51 from each other; and the plurality of second metal units 61 from each other.

In this embodiment, the insulating structures 90 include a first passivation layer 902, a second passivation layer 903 overlapping with the first passivation layer 902, and a third passivation layer 904 overlapping with the second passivation layer 903. In the manufacturing process, the first passivation layer 902 and the second passivation layer 903 are formed on the upper substrate 10 to insulate the sub-pixels 321 from each other. The third passivation layer 904 is formed on the circuit layer 70 of the lower substrate 80 to insulate the second metal units 61 from each other. Then each first metal unit 41 is electrically coupled to one second metal unit 61 by the anisotropic conductive unit 51 so that the control circuit layer 70 can electrically couple to each first metal unit 41, and a voltage signal is provided to its corresponding micro LED 31 through the first metal units 41.

Figure 2A:
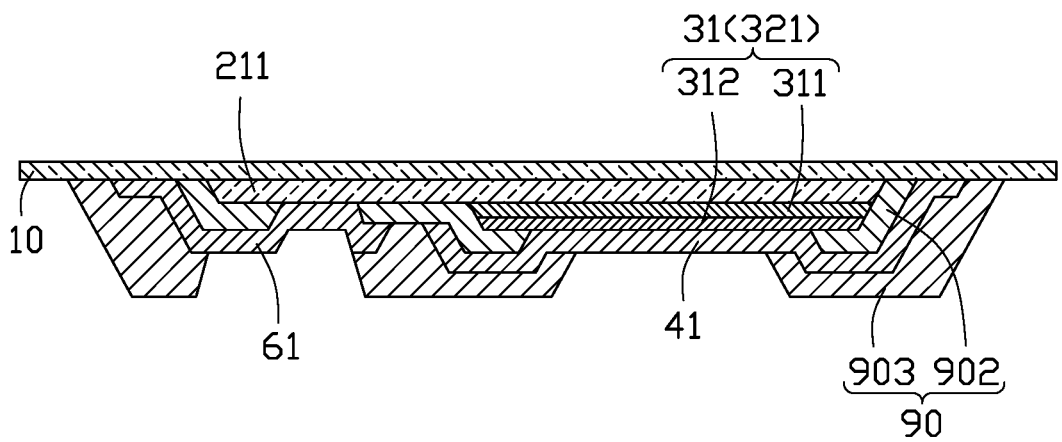
FIG. 2A is another cross-sectional view of a first embodiment of a micro LED display panel.

FIG. 2A illustrates a micro LED display panel 100 according to the first embodiment of the present disclosure. The control circuit layer 70 and the lower substrate 80 are not shown in FIG. 2A. As shown in FIG. 2A, each first metal unit 41 completely covers the corresponding P-type doped inorganic non-metal layer 312. A projection of each first metal unit 41 on the upper substrate 10 completely overlaps with a projection of the corresponding P-type doped inorganic non-metal layer 312 on the upper substrate 10.

Figure 2B:
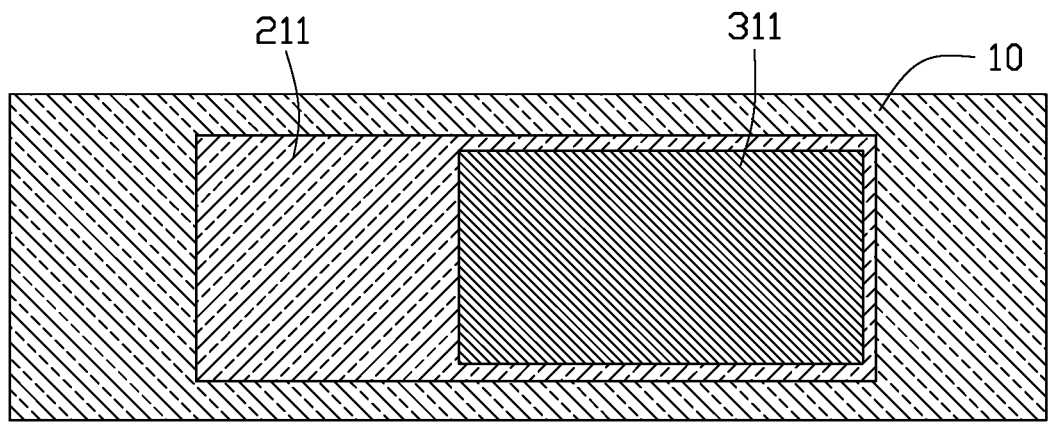
FIG. 2B shows projections of the transparent conductive unit and the N-type doped inorganic non-metal layer of the micro LED display panel shown in FIG. 2A on the upper substrate.

FIG. 2B shows projections of the transparent conductive unit 211 and the N-type doped inorganic non-metal layer 311 shown in FIG. 2A on the upper substrate 10. As shown in FIG. 2B, each transparent conductive unit 211 completely covers its corresponding N-type doped inorganic non-metal layer 311. A projection of each N-type doped inorganic non-metal layer 311 on the upper substrate 10 completely overlaps with a projection of its corresponding transparent conductive unit 211 on the upper substrate 10.

Figure 2C:
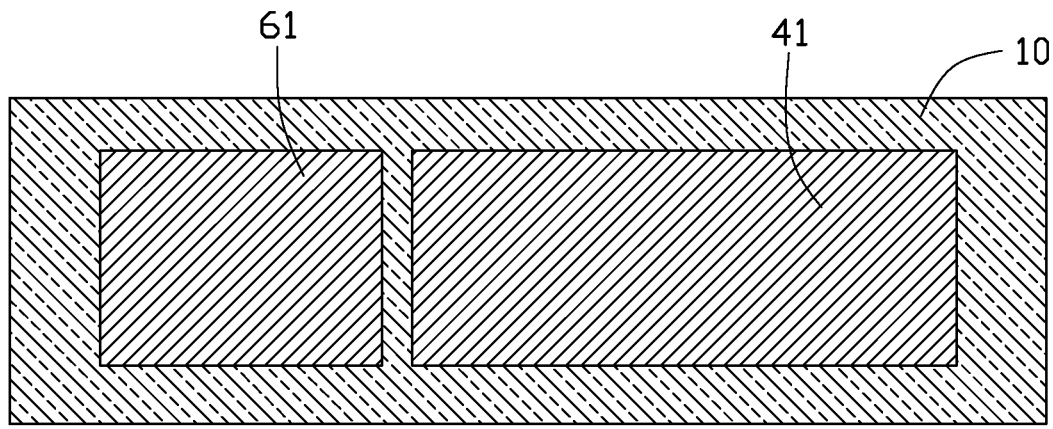
FIG. 2C shows projections of the first metal unit and the second metal unit of the micro LED display panel shown in FIG. 2A on the upper substrate.

FIG. 2C shows projections of the first metal unit 41 and the second metal unit 61 shown in FIG. 2A on the upper substrate 10. Referring to FIG. 2A and FIG. 2C, a portion of the transparent conductive unit 211 not covered by the N-doped inorganic non-metal layer 311 is in electrical contact with a second metal unit 61. Each second metal unit 61 is electrically coupled to the control circuit layer 70. The control circuit layer 70 is electrically coupled to the transparent conductive unit 211 by the second metal units 61.

Figure 3:
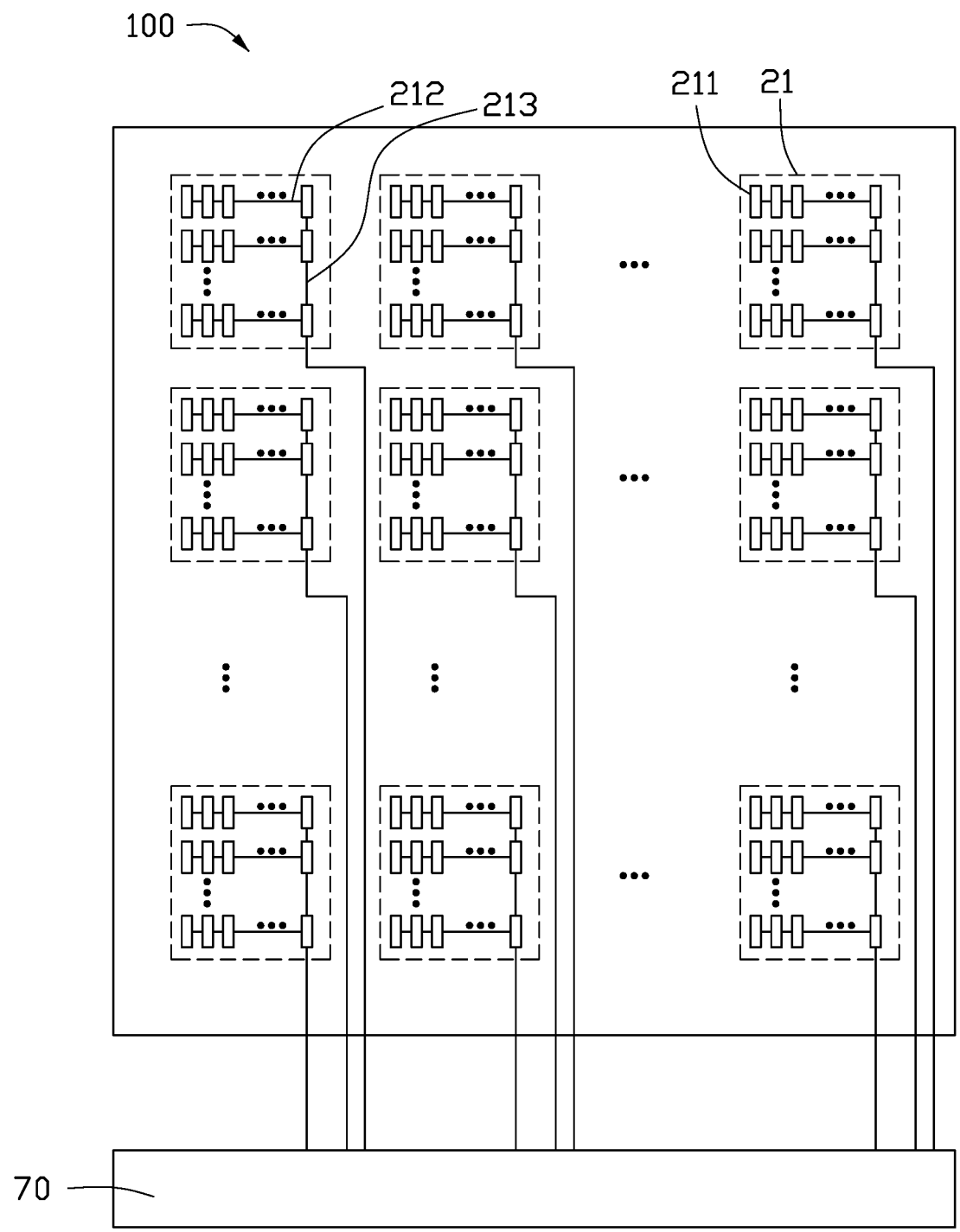
FIG. 3 is a plan view of a first embodiment of a micro LED display panel.

FIG. 3 illustrates a micro LED display panel 100 according to a first embodiment of the present disclosure. As shown in FIG. 3, all transparent conductive units 211 are arranged in a matrix of a plurality of rows and a plurality of columns, and the transparent conductive units 211 form a plurality of touch units 21. Each of the touch units 21 comprises at least two adjacent transparent conductive units 211. In each touch unit 21, the transparent conductive units 211 in a same row are electrically coupled together by a first lead 212. Each touch unit 21 is independently electrically coupled to the signal source of the control circuit layer 70 by a second lead 213. The control circuit layer 70 is used to apply a direct current voltage signal or an alternating current voltage signal to each touch unit 21.

In this embodiment, the transparent conductive units 211 in one touch unit 21 are arranged in a rectangle with a side length of approximately 3 to 4 millimeters.

In this embodiment, each sub-pixel 321 includes one transparent conductive unit 211. The transparent conductive unit 211 is alternately used as a cathode of the micro LED 31 and a touch electrode of the micro LED display panel 100 in a time-division driving manner.

During the display period, the transparent conductive units 211 serve as the cathodes of the corresponding micro LEDs 31. The control circuit layer 70 applies a direct current voltage signal to each transparent conductive unit 211 of the touch unit 21 by the second lead 213 and the first leads 212. The potential of the cathode (transparent conductive unit 211) of each micro LED 31 in the touch unit is lower than the potential of the anode (first metal unit 41) of the micro LED 31, so that each micro LED 31 emits light, and the micro LED display panel realizes the display function.

In this embodiment, during the touch period, the touch units 21 may be multiplexed as self-capacitance touch electrodes or multiplexed as mutual-capacitance touch electrodes.

Referring to FIG. 3, during the touch period, if the touch units 21 are multiplexed as self-capacitance touch electrodes, the control circuit layer 70 applies an alternating current voltage signal as a driving signal to each transparent conductive unit 211 in the touch unit 21 by the second lead 213 and the first leads 212. Specifically, the alternating current voltage signal may be a sine wave, a square wave, a triangular wave, a sawtooth wave, and the like.

Further, the control circuit layer 70 is configured to receive and process the capacitive sensing signal of the touch unit 21. The capacitance sensing signals of the transparent conductive units 211 in each row of the touch unit 21 shown in FIG. 3 are accumulated to the second lead 213 by the first lead 212 electrically coupled the transparent conductive units 211, and received by the control circuit layer 70 by the second lead 213. When a conductive object (such as a finger) touches the upper substrate 10, the capacitive sensing signal varies in the touch area/point, wherein the capacitive sensing signal is received and processed in the control circuit layer 70, and then the relative position of the touch point can be accurately determined.

In this embodiment, the capacitance sensing signal read by the control circuit layer 70 is a sum of the capacitance sensing signals of the transparent conductive units 211 in the touch unit 21, and the sensitivity of the touch point detection is improved by avoiding the capacitance sensing signals having a small, difficult to detect, change.

Referring to FIG. 3, during the touch period, if the touch units 21 are multiplexed as mutual-capacitance touch electrodes, the touch units 21 include touch driving electrodes and touch receiving electrodes. The touch units 21 are arranged in a matrix. The touch units 21 include a plurality of rows of touch driving electrodes and a plurality of rows of touch receiving electrodes. The plurality of rows of touch driving electrodes and the plurality of rows of touch receiving electrodes are spaced apart from each other and arranged alternately along a columnar direction. In the columnar direction, each row of touch driving electrodes alternates with one row of touch receiving electrodes. In other embodiments, the touch units 21 may include a plurality of columns of touch driving electrodes and a plurality of columns of touch receiving electrodes. The plurality of column of touch driving electrodes and the plurality of column of touch receiving electrodes are spaced apart from each other and arranged alternately along a row direction. In the row direction, each column of touch driving electrodes alternates with one column of touch receiving electrodes. In this embodiment, the control circuit layer 70 applies an alternating current voltage signal as a driving signal to each touch driving electrode by the second lead 213 and the first leads 212. The alternating current voltage signal may be a sine wave, a square wave, a triangular wave, a sawtooth wave, and the like.

Further, the control circuit layer 70 is configured to receive and process the capacitive sensing signals of the touch units 21 multiplexed as touch receiving electrodes. Specifically, the capacitive sensing signals of the transparent conductive units 211 of each row in the touch unit 21 multiplexed as touch receiving electrodes in FIG. 3 are accumulated to the second lead 213 by the first leads 212 electrically coupled the transparent conductive units 211, and received by the control circuit layer 70 by the second lead 213. When a conductive object (such as a finger) touches the upper substrate 10, the capacitive sensing signal varies in the touch area/point, wherein the capacitive sensing signal is received and processed in the control circuit layer 70, and then the relative position of the touch point can be determined. Thus, the micro LED display panel 100 of the embodiment of the present disclosure has both a display function and a touch function.

Figure 4A:
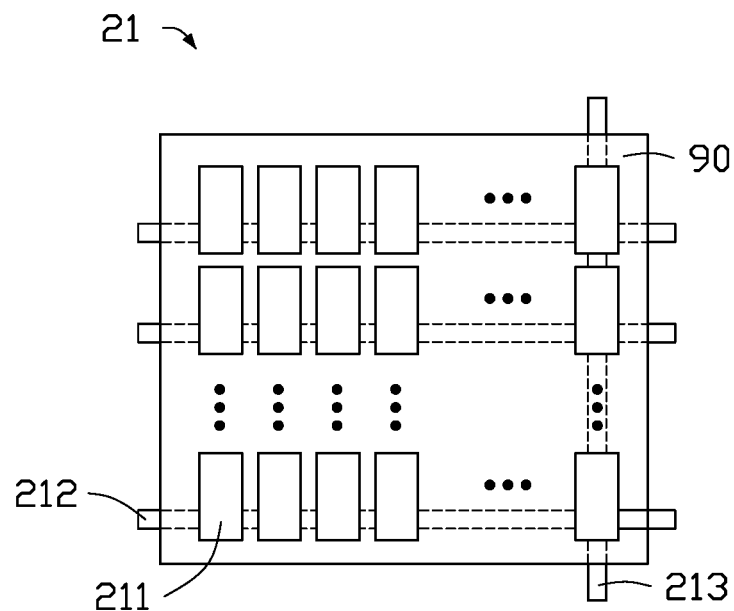
FIG. 4A is a front view of a touch unit of a first embodiment of a micro LED display panel.
Figure 4B:
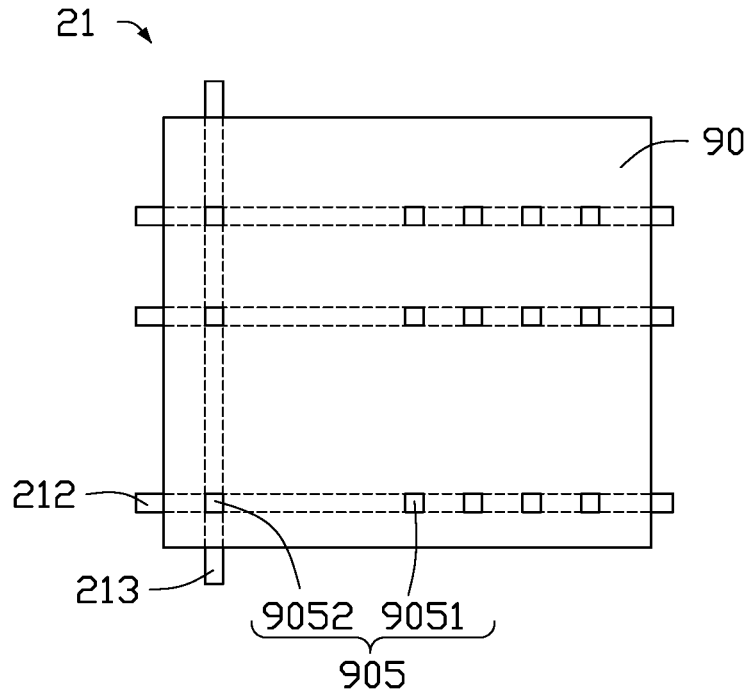
FIG. 4B is a rear view of the touch unit of the micro LED display panel shown in FIG. 4A.

FIG. 4A illustrates a touch unit 21 of a micro LED display panel 100 according to a first embodiment of the present disclosure. FIG. 4B illustrates the touch unit 21 of the micro LED display panel 100 shown in FIG. 4A. As shown in FIG. 4A and FIG. 4B, the touch unit 21 includes a plurality of transparent conductive units 211. The transparent conductive units 211 are arranged in a matrix in a plurality of rows and a plurality of columns. Transparent conductive units 211 in the same row are electrically coupled together by the first lead 212. Transparent conductive units 211 in different rows are electrically coupled together by the second lead 213.

As shown in FIG. 4B, the insulating structure 90 defines a via hole 905 for the first lead 212 and the second lead 213 to pass through. The via hole 905 includes a first via hole 9051 and a second via hole 9052. The first via hole 9051 allowed electrically coupling the first lead 212 and the corresponding transparent conductive unit 211. The second via hole 9052 allowed electrically coupling the first lead 212, the second lead 213, and the corresponding transparent conductive unit 211.

Second Embodiment

Figure 5:
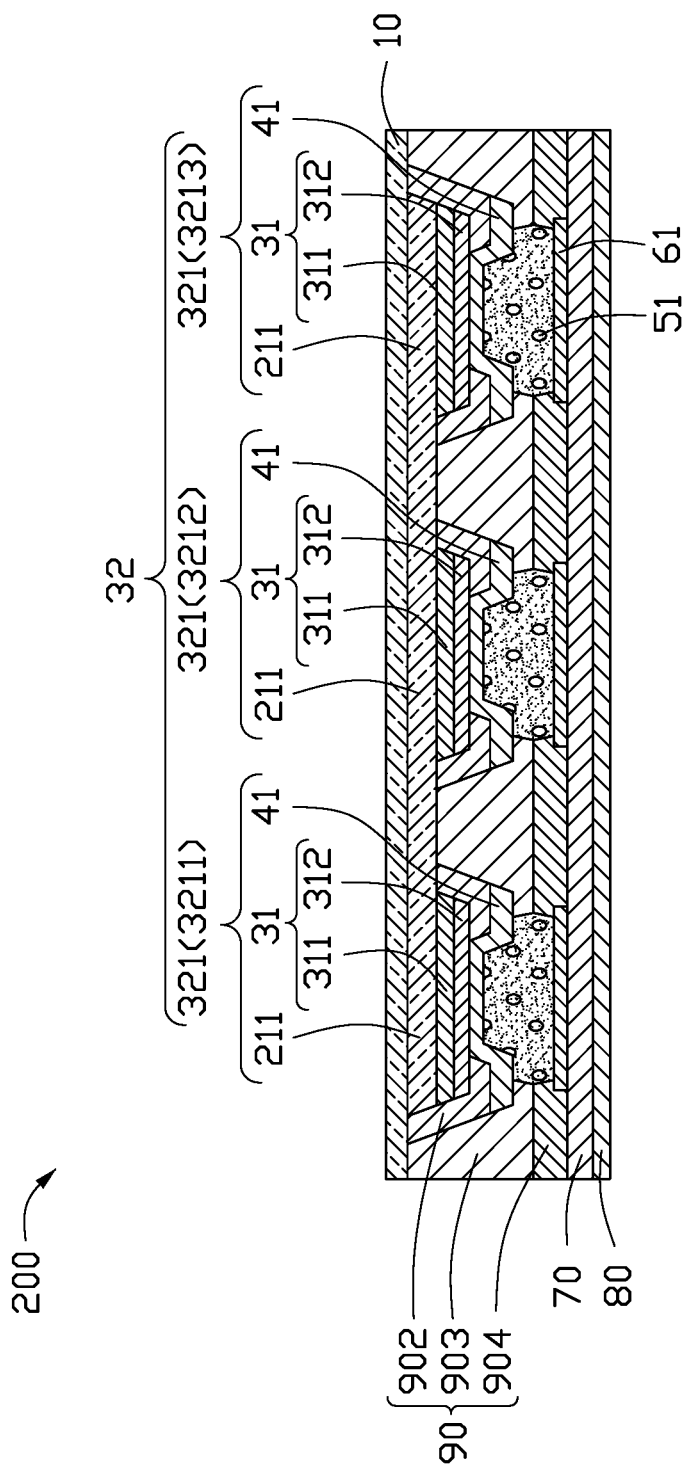
FIG. 5 is a cross-sectional view of a second embodiment of a micro LED display panel.
Figure 6:
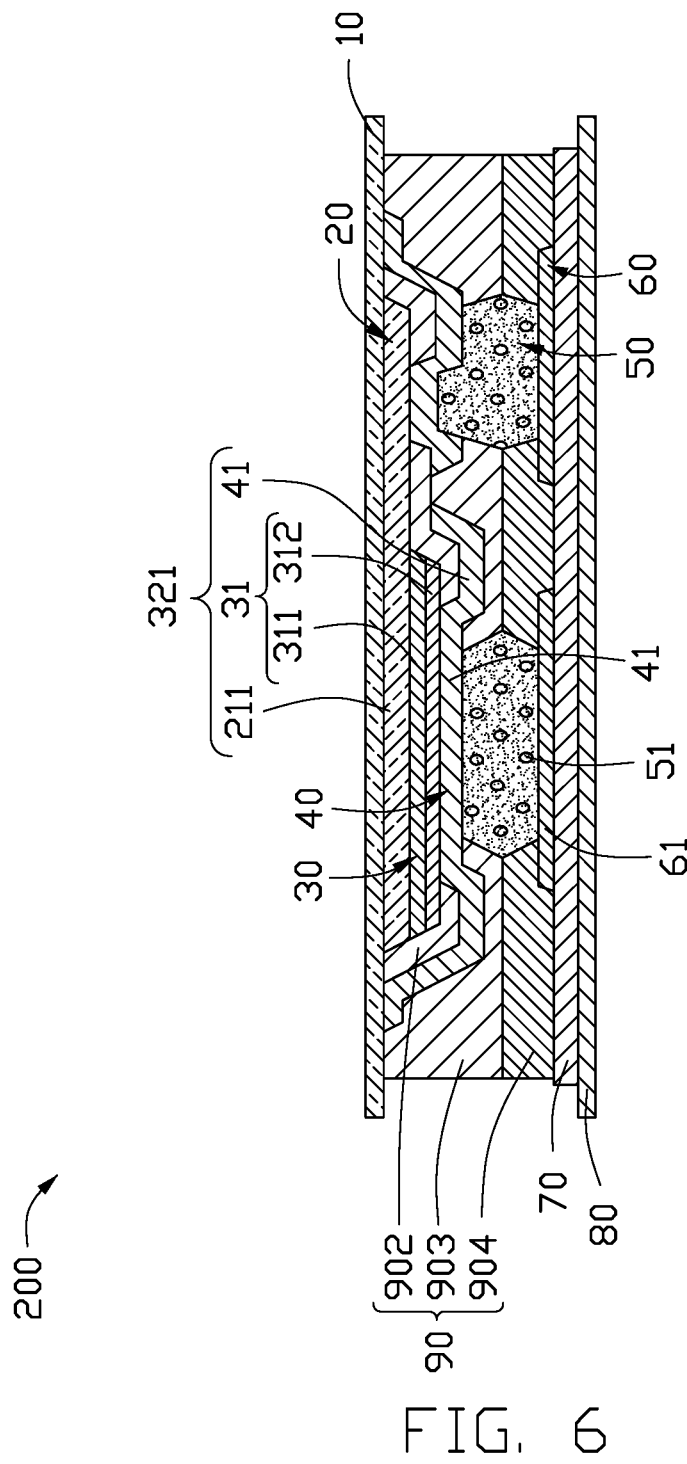
FIG. 6 is another cross-sectional view of a second embodiment of a micro LED display panel.

FIG. 5 illustrates a micro LED display panel 200 according to a second embodiment of the present disclosure. FIG. 6 illustrates a micro LED display panel 200 according to a second embodiment of the present disclosure. Referring to FIG. 5 and FIG. 6, the micro LED display panel 200 is substantially the same as the micro LED display panel 100 of the first embodiment of the present disclosure, including the upper substrate 10, the transparent conductive layer 20, the micro LED layer 30, the first metal layer 40, the anisotropic conductive material layer 50, the second metal layer 60, the control circuit layer 70, and the lower substrate 80 that are also sequentially stacked.

The upper substrate 10 is transparent, the transparent conductive layer 20 includes a plurality of transparent conductive units 211 spaced apart from each other, the micro LED layer 30 includes a plurality of micro LEDs 31 spaced apart from each other and the first metal layer 40 includes a plurality of firsts metal unit 41 spaced apart from each other. The anisotropic conductive material layer 50 includes a plurality of anisotropic conductive units 51 spaced apart from each other, and the second metal layer 60 includes a plurality of second metal units 61 spaced apart from each other, and each anisotropic conductive unit 51 can electrically couple one first metal unit 41 and one second metal unit 61. Each first metal unit 41 is electrically coupled to the control circuit layer 70, and applied with a voltage signal by the control circuit layer 70. The first metal units 41 serve as anodes or cathodes of the micro LEDs 31. The transparent conductive units 211 serve as cathodes or anodes of the micro LEDs 31 and are multiplexed as touch electrodes. When the first metal units 41 serve as anodes of the micro LEDs 31, the transparent conductive units 211 serve as cathodes of the micro LEDs 31. Alternatively, when the first metal units 41 serve as cathodes of the micro LEDs 31, the transparent conductive units 211 serve as anodes of the micro LEDs 31.

Referring to FIG. 5, the micro LED display panel 200 includes a plurality of sub-pixels 321, and a plurality of adjacent sub-pixels 321 emitting light of different colors form one pixel 32. In this embodiment, each pixel 32 includes three adjacent sub-pixels 321, each sub-pixel 321 emitting one of three different colors. The three adjacent sub-pixels 321 are a first color sub-pixel 3211, a second color sub-pixel 3212, and a third color sub-pixel 3213. The first color sub-pixel 3211 includes a red micro LED 31 emitting red light, the second color sub-pixel 3212 includes a green micro LED 31 emitting green light, and the third color sub-pixel 3213 includes a blue micro LED 31 emitting blue light. In other embodiments of the present disclosure, the first color sub-pixels 3211, the second color sub-pixels 3212, and the third color sub-pixels 3213 may also include micro LEDs 31 that emit other colored lights.

In other embodiments, each pixel 32 may also include three or more adjacent sub-pixels. For example, four adjacent sub-pixels 321 may form one pixel 32. The adjacent four sub-pixels 321 may include a red micro LED 31 emitting red light, a green micro LED 31 emitting green light, a blue micro LED 31 emitting blue light, and a white micro LED 31 emitting white light.

Referring to FIG. 5, each micro LED 31 includes an N-type doped inorganic non-metal layer 311, a P-type doped inorganic non-metal layer 312, and an active layer (not shown) between the N-type doped inorganic non-metal layer 311 and the P-type doped inorganic non-metal layer 312. By adjusting the material of the active layer of the micro LED 31, the color of light emitted by the micro LED 31 can be of different colors. Thus, different sub-pixels 321 can emit light of different colors.

Additionally, the micro LED display panel 200 also includes a plurality of insulating structures 90. The insulating structures 90 insulate: the transparent conductive units 211 from each other; the micro LEDs 31 from each other; the first metal units 41 from each other; the anisotropic conductive unit 51 from each other and the second metal units 61 from each other.

The difference between the micro LED display panel 200 in this embodiment and the micro LED display panel 100 in the first embodiment is that in the first embodiment, each sub-pixel 321 includes a transparent conductive unit 211. In the present embodiment, the plurality of sub-pixels 321 form a plurality of pixels 32, each pixel 32 includes at least three adjacent sub-pixels 321 emitting light of different colors, the sub-pixels 321 in at least one pixel 32 share one single transparent conductive unit 211.

Figure 7:
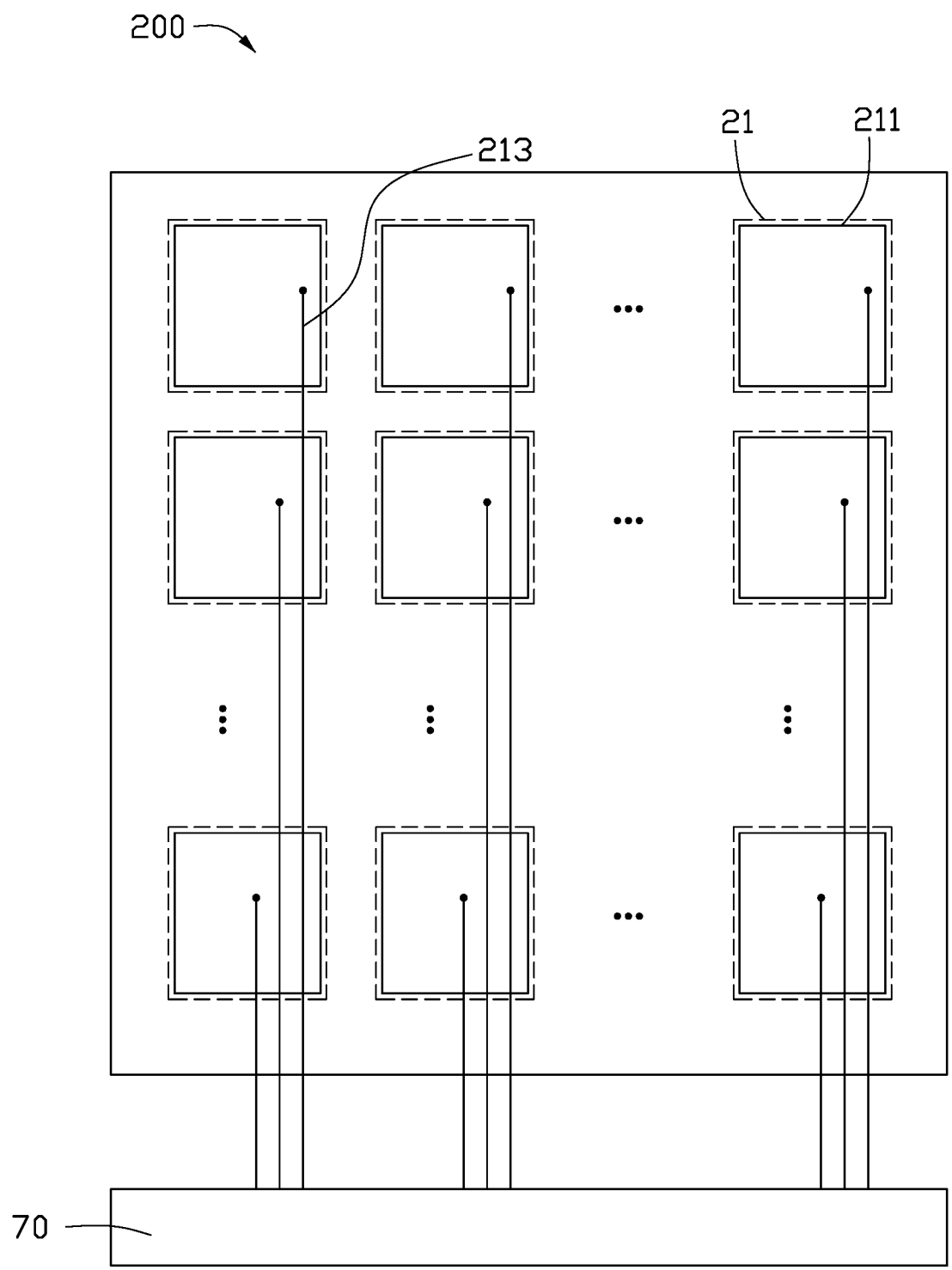
FIG. 7 is a plan view of a second embodiment of a micro LED display panel.

FIG. 7 illustrates a micro LED display panel 200 according to a second embodiment of the present disclosure. As shown in FIG. 7, all the transparent conductive units 211 are arranged in a matrix of a plurality of rows and a plurality of columns, and the transparent conductive units 211 forms a plurality of touch units 21, each of the touch units 21 comprises one of the transparent conductive units 211. Each transparent conductive unit 211 is independently electrically coupled to the control circuit layer 70 by a second lead 213. The control circuit layer 70 is used to apply a direct current voltage signal or an alternating current voltage signal to the transparent conductive units 211.

In this embodiment, the transparent conductive unit 211 in the touch unit 21 is a rectangle with a side length of approximately three to four millimeters.

In this embodiment, a plurality of sub-pixels 321 of at least one pixel 32 share one single transparent conductive unit 211. The transparent conductive units 211 are alternately used as cathodes of the micro LED 31 and touch electrodes of the micro LED display panel 200 in a time-division driving manner.

During the display period, the transparent conductive unit 211 serves as the cathode of its corresponding micro LED 31. The control circuit layer 70 applies a direct current voltage signal to the transparent conductive unit 211 in the touch unit 21 by the second lead 213 so that the potential of the cathode (transparent conductive unit 211) of each micro LED 31 corresponding to the transparent conductive unit 211 is lower than the potential of the anode (first metal unit 41) of the micro LED 31, so that each micro LED 31 emits light, and the micro LED display panel 200 realizes the display function.

In this embodiment, during the touch period, the touch units 21 may be multiplexed as self-capacitance touch electrodes or multiplexed as mutual-capacitance touch electrodes.

Referring to FIG. 7, during the touch period, if the touch units 21 are multiplexed as self-capacitance touch electrodes, the control circuit layer 70 applies an alternating current voltage signal as a drive signal to the transparent conductive units 211 in the touch units 21 by the second lead 213. The alternating current voltage signal may be a sine wave, a square wave, a triangular wave, a sawtooth wave, and the like.

Further, the control circuit layer 70 is configured to receive and process the capacitive sensing signal of the touch unit 21. The capacitance sensing signals of the transparent conductive unit 211 in the touch unit 21 shown in FIG. 7 are received by the control circuit layer 70 by the second lead 213. When a conductive object (such as a finger) touches the upper substrate 10, the capacitive sensing signal varies in the touch area/point, wherein the capacitive sensing signal is received and processed in the control circuit layer 70, and then the relative position of the touch point can be accurately determined.

Referring to FIG. 7, during the touch period, if the touch units 21 are multiplexed as mutual-capacitance touch electrodes, the touch units 21 include touch driving electrodes and touch receiving electrodes. The touch units 21 are arranged in a matrix. The touch units 21 include a plurality of rows of touch driving electrodes and a plurality of rows of touch receiving electrodes. The rows of touch driving electrodes and the rows of touch receiving electrodes are spaced apart from each other and alternately arranged along a columnar direction. In the columnar direction, each row of touch driving electrodes alternates with a row of touch receiving electrodes.

In other embodiments, the touch units 21 may include a plurality of columns of touch driving electrodes and a plurality of columns of touch receiving electrodes. The columns of touch driving electrodes and the columns of touch receiving electrodes are spaced apart from each other and arranged alternately along a row direction. In the row direction, each column of touch driving electrodes alternates a column of touch receiving electrodes.

In this embodiment, the control circuit layer 70 applies an alternating current voltage signal as a driving signal to each touch driving electrode by the second lead 213. The alternating current voltage signal may be a sine wave, a square wave, a triangular wave, a sawtooth wave, and the like.

Further, the control circuit layer 70 can receive and process the capacitive sensing signals of the touch units 21 multiplexed as touch receiving electrodes. The capacitance sensing signal of the transparent conductive unit 211 in the touch unit 21 multiplexed as a receiving electrode in FIG. 7, is received by the control circuit layer 70 by the second lead 213. When a conductive object (such as a finger) touches the upper substrate 10, the capacitive sensing signal varies in the touch area/point, wherein the capacitive sensing signal is received and processed in the control circuit layer 70, and then the relative position of the touch point can be accurately determined. In this way, the micro LED display panel 200 of the embodiment of the present disclosure has both a display function and a touch function.

The above embodiments are only used to illustrate the technical solutions of the present disclosure and are not limited thereto. Although the present disclosure has been described in detail with reference to the preferred embodiments, those skilled in the art should understand that the technical solutions of the present disclosure can be modified or equivalently replaced without departing from the spirit and scope of the technical solution of the present disclosure.

What is claimed is:

1. A micro LED display panel, comprising:
a first metal layer, the first metal layer comprising a plurality of first metal units spaced apart from each other;
a micro LED layer on the first metal layer, the micro LED layer comprising a plurality of micro LEDs spaced apart from each other, the plurality of first metal units serving as anodes or cathodes of the plurality of micro LEDs;
a transparent conductive layer on a side of the micro LED layer opposite from the first metal layer;
a control circuit layer on a side of the first metal layer away from the transparent conductive layer; and
a second metal layer on a side of the control circuit layer adjacent to the first metal layer, the second metal layer being between the control circuit layer and the first metal layer, the second metal layer comprising a plurality of second metal units spaced apart from each other, each of the plurality of second metal units being electrically coupled to the control circuit layer;
wherein the transparent conductive layer comprises a plurality of transparent conductive units spaced apart from each other, the plurality of transparent conductive units serve as anodes or cathodes of the plurality of micro LEDs and the plurality of transparent conductive units are multiplexed as touch electrodes;
wherein the micro LED display panel further comprises an anisotropic conductive material layer between the first metal layer and the second metal layer; the anisotropic conductive material layer is composed of a plurality of anisotropic conductive material units spaced apart from each other; each of the plurality of anisotropic conductive units is electrically coupled to one of the plurality of first metal units and one of the plurality of second metal units.

2. The micro LED display panel of claim 1, wherein each of the plurality of transparent conductive units is independently electrically coupled to the control circuit layer.

3. The micro LED display panel of claim 1, wherein the plurality of transparent conductive units form a plurality of touch units, each of the plurality of touch units comprises at least two of the plurality of transparent conductive units, and the at least two of the plurality of transparent conductive units in each of the plurality of touch units are electrically coupled together and each of the plurality of touch units is independently electrically coupled to the control circuit layer, and the control circuit layer is configured to apply a current voltage signal to each of the plurality of touch units.

4. The micro LED display panel of claim 3, wherein each of the plurality of touch units serves as a self-capacitance touch electrode.

5. The micro LED display panel of claim 3, wherein each of the plurality of touch units serves as a mutual-capacitance touch electrode, and the plurality of touch units comprise touch driving electrodes and touch receiving electrodes.

6. The micro LED display panel of claim 5, wherein the plurality of touch units are arranged in a matrix, the plurality of the touch units comprise a plurality of rows of touch driving electrodes and a plurality of rows of touch receiving electrodes;
the plurality of rows of touch driving electrodes and the plurality of rows of touch receiving electrodes are spaced apart from each other and arranged alternately along a columnar direction; in the columnar direction, each row of touch driving electrodes alternates with one row of touch receiving electrodes.

7. The micro LED display panel of claim 5, wherein the plurality of touch units are arranged in a matrix, the plurality of the touch units comprises a plurality of columns of touch driving electrodes and a plurality of columns of touch receiving electrodes; the plurality of columns of touch driving electrodes and the plurality of columns of touch receiving electrodes are spaced apart from each other and arranged alternately along a row direction; in the row direction, each column of touch driving electrodes alternates with one column of touch receiving electrodes.

8. The micro LED display panel of claim 1, further comprising a plurality of sub-pixels, each of the plurality of sub-pixels comprises one of the plurality of micro LEDs, one of the plurality of transparent conductive units, and one of the plurality of first metal units overlapped with each other.

9. The micro LED display panel of claim 8, wherein the plurality of sub-pixels form a plurality of pixels, each of the plurality of pixels comprises at least three adjacent sub-pixels emitting light of different colors, and the sub-pixels in at least one of the plurality of pixels share one single of the plurality of transparent conductive units.

10. The micro LED display panel of claim 1, further comprising a plurality of insulating structures, wherein the plurality of insulating structures is configured to insulate the plurality of transparent conductive units from each other, insulate the plurality of micro LEDs from each other, and insulate the plurality of first metal units from each other.

11. A micro LED display panel, comprising:
a first metal layer, the first metal layer comprising a plurality of first metal units spaced apart from each other;
a micro LED layer on the first metal layer, the micro LED layer comprising a plurality of micro LEDs spaced apart from each other, the plurality of first metal units serving as anodes or cathodes of the plurality of micro LEDs;
a transparent conductive layer on a side of the micro LED layer opposite from the first metal layer;
a control circuit layer on a side of the first metal layer away from the transparent conductive layer; and
a second metal layer on a side of the control circuit layer adjacent to the first metal layer, the second metal layer being between the control circuit layer and the first metal layer, the second metal layer comprising a plurality of second metal units spaced apart from each other, each of the plurality of second metal units being electrically coupled to the control circuit layer;
wherein the micro LED display panel further comprises an anisotropic conductive material layer between the first metal layer and the second metal layer; the anisotropic conductive material layer is composed of a plurality of anisotropic conductive material units spaced apart from each other; each of the plurality of anisotropic conductive units is electrically coupled to one of the plurality of first metal units and one of the plurality of second metal units;

wherein the transparent conductive layer comprises a plurality of transparent conductive units spaced apart from each other, during the display period, each of the plurality of transparent conductive units is applied a direct current voltage signal, and during the touch period, each of the plurality of transparent conductive units is applied an alternating current voltage signal as a driving signal.

12. The micro LED display panel of claim 11, wherein the control circuit layer is configured to apply the direct current voltage signal and the alternating current voltage signal to each of the plurality of transparent conductive units.

13. The micro LED display panel of claim 12, wherein each of the plurality of transparent conductive units is independently electrically coupled to the control circuit layer.

14. The micro LED display panel of claim 12, wherein the plurality of transparent conductive units form a plurality of touch units, each of the plurality of touch units comprises at least two of the plurality of transparent conductive units, and the at least two of the plurality of transparent conductive units in each of the plurality of touch units are electrically coupled together and each of the plurality of touch units is independently electrically coupled to the control circuit layer.

15. The micro LED display panel of claim 11, further comprising a plurality of sub-pixels, each of the plurality of sub-pixels comprises one of the plurality of micro LEDs, one of the plurality of transparent conductive units, and one of the plurality of first metal units overlapped with each other.

16. The micro LED display panel of claim 15, wherein the plurality of sub-pixels form a plurality of pixels, each of the plurality of pixels comprises at least three adjacent sub-pixels emitting light of different colors, and the sub-pixels in at least one of the plurality of pixels share one single of the plurality of transparent conductive units.

17. A micro LED display panel, comprising:
a first metal layer, the first metal layer comprising a plurality of first metal units spaced apart from each other;
a micro LED layer on the first metal layer, the micro LED layer comprising a plurality of micro LEDs spaced apart from each other, the plurality of first metal units serving as anodes or cathodes of the plurality of micro LEDs;
a transparent conductive layer on a side of the micro LED layer opposite from the first metal layer;
a control circuit layer on a side of the first metal layer away from the transparent conductive layer; and
a second metal layer on a side of the control circuit layer adjacent to the first metal layer, the second metal layer being between the control circuit layer and the first metal layer, the second metal layer comprising a plurality of second metal units spaced apart from each other, each of the plurality of second metal units being electrically coupled to the control circuit layer;
wherein the micro LED display panel further comprises an anisotropic conductive material layer between the first metal layer and the second metal layer; the anisotropic conductive material layer is composed of a plurality of anisotropic conductive material units spaced apart from each other; each of the plurality of anisotropic conductive units is electrically coupled to one of the plurality of first metal units and one of the plurality of second metal units;
wherein the transparent conductive layer comprises a plurality of transparent conductive units spaced apart from each other, the plurality of transparent conductive units are multiplexed as touch electrodes, and the touch electrodes comprise a plurality of touch driving electrodes and a plurality of touch receiving electrodes;
during the display period, each of the plurality of transparent conductive units is applied a direct current voltage signal; during the touch period, each of the plurality of touch driving electrodes is applied an alternating current voltage signal as a driving signal.

* * * * *